(12) United States Patent
Prasad et al.

(10) Patent No.: US 11,600,507 B2
(45) Date of Patent: Mar. 7, 2023

(54) PEDESTAL ASSEMBLY FOR A SUBSTRATE PROCESSING CHAMBER

(71) Applicant: Applied Materials, Inc., Santa Clara, CA (US)

(72) Inventors: Bhaskar Prasad, Jamshedpur (IN); Kirankumar Neelasandra Savandaiah, Bangalore (IN); Srinivasa Rao Yedla, Bangalore (IN); Nitin Bharadwaj Satyavolu, Kakinada (IN); Thomas Brezoczky, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 357 days.

(21) Appl. No.: 17/016,030

(22) Filed: Sep. 9, 2020

(65) Prior Publication Data

US 2022/0076979 A1   Mar. 10, 2022

(51) Int. Cl.
*H01L 21/683* (2006.01)
*H01L 21/68* (2006.01)
(Continued)

(52) U.S. Cl.
CPC .............. *H01L 21/68* (2013.01); *B65G 47/92* (2013.01); *H01L 21/67167* (2013.01);
(Continued)

(58) Field of Classification Search
CPC ... B65G 47/92; H01L 21/67167; H01L 21/68; H01L 21/6833; H01L 21/68735; H01L 21/68742
See application file for complete search history.

(56) References Cited

U.S. PATENT DOCUMENTS 5,281,295 A * 1/1994 Maeda .............. H01L 21/67196
                                              118/730
5,663,884 A * 9/1997 Nishihata ........... G05B 19/4184
                                              700/121
(Continued)

FOREIGN PATENT DOCUMENTS

CN          100411095 C      8/2008
CN          102965643 B      2/2016
(Continued)

OTHER PUBLICATIONS

International Search Report and Written Opinion dated Sep. 4, 2020 for Application No. PCT/US2020/033456.

*Primary Examiner* — Saul Rodriguez
*Assistant Examiner* — Brendan P Tighe
(74) *Attorney, Agent, or Firm* — Patterson & Sheridan, LLP

(57) ABSTRACT

A pedestal assembly for a processing region and comprising first pins coupled to a substrate support, configured to mate with first terminals of an electrostatic chuck, and are configured to be coupled to a first power source. Each of the first pins comprises an interface element, and a compliance element supporting the interface element. Second pins are coupled to the substrate support, configured to mate with second terminals of the electrostatic chuck, and configured to couple to a second power source. Alignment elements are coupled to the substrate support and are configured to interface with centering elements of the electrostatic chuck. The flexible element is coupled to the substrate support, configured to interface with a passageway of the electrostatic chuck, and configured to be coupled to a gas source.

20 Claims, 10 Drawing Sheets

(51) Int. Cl.
*B65G 47/92* (2006.01)
*H01L 21/687* (2006.01)
*H01L 21/67* (2006.01)

(52) U.S. Cl.
CPC .... *H01L 21/6833* (2013.01); *H01L 21/68735* (2013.01); *H01L 21/68742* (2013.01)

(56) References Cited

U.S. PATENT DOCUMENTS

| | | | |
|---|---|---|---|
| 5,863,170 A | 1/1999 | Boitnott et al. | |
| 5,879,459 A | 3/1999 | Gadgil et al. | |
| 6,162,299 A | 12/2000 | Raaijmakers | |
| 6,440,261 B1 | 8/2002 | Tepman et al. | |
| 6,447,607 B2 | 9/2002 | Soininen et al. | |
| 6,560,896 B2* | 5/2003 | Granneman | H01L 21/67103 34/367 |
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamakazi | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,349,085 B2* | 1/2013 | Tahara | C23C 16/4401 156/345.31 |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,905 B2 | 8/2014 | van der Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,529,585 B2* | 1/2020 | Manna | C23C 16/32 |
| 10,586,720 B2 | 3/2020 | Weaver et al. | |
| 10,636,677 B2* | 4/2020 | Delmas | H01L 21/67023 |
| 10,643,867 B2* | 5/2020 | Delmas | F01K 17/04 |
| 10,865,475 B2* | 12/2020 | Raisanen | C23C 16/45525 |
| 10,867,788 B2* | 12/2020 | Blanquart | H01L 21/02211 |
| 10,872,771 B2* | 12/2020 | Raisanen | C23C 16/32 |
| 11,101,370 B2* | 8/2021 | Tang | H01L 29/66833 |
| 11,306,395 B2* | 4/2022 | Shero | C23C 16/52 |
| 11,443,926 B2* | 9/2022 | Jeong | C23C 16/4412 |
| 11,453,943 B2* | 9/2022 | Fukazawa | C23C 16/45553 |
| 2002/0051698 A1 | 5/2002 | Birkner et al. | |
| 2002/0170671 A1 | 11/2002 | Matsushita et al. | |
| 2003/0109094 A1 | 6/2003 | Seidel et al. | |
| 2004/0159553 A1 | 8/2004 | Nogami et al. | |
| 2004/0261710 A1 | 12/2004 | Matsushita et al. | |
| 2005/0005850 A1 | 1/2005 | Yamakazi | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2009/0087286 A1 | 4/2009 | van der Meulen | |
| 2009/0173622 A1 | 7/2009 | Weichart et al. | |
| 2009/0180847 A1 | 7/2009 | Guo et al. | |

(56) References Cited

U.S. PATENT DOCUMENTS

| | | |
|---|---|---|
| 2010/0012036 A1 | 1/2010 | Silva et al. |
| 2010/0075453 A1 | 3/2010 | Kurita et al. |
| 2010/0120238 A1 | 5/2010 | Kitano et al. |
| 2010/0281683 A1 | 11/2010 | White et al. |
| 2010/0304027 A1 | 12/2010 | Lee et al. |
| 2010/0327187 A1 | 12/2010 | Beloussov et al. |
| 2012/0027542 A1 | 2/2012 | Isomura et al. |
| 2012/0031749 A1 | 2/2012 | Dubs et al. |
| 2012/0328797 A1 | 12/2012 | Maass et al. |
| 2013/0302115 A1 | 11/2013 | Wakabayashi et al. |
| 2014/0262035 A1 | 9/2014 | Merry et al. |
| 2014/0349011 A1 | 11/2014 | Weichart |
| 2015/0063957 A1 | 3/2015 | Olgado |
| 2015/0240360 A1 | 8/2015 | Leeser |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2018/0142350 A1 | 5/2018 | Fukiage et al. |
| 2018/0195173 A1 | 7/2018 | Kato et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0013225 A1 | 1/2019 | Taguchi et al. |
| 2019/0096715 A1 | 3/2019 | Lodder et al. |
| 2019/0252160 A1 | 8/2019 | Balon et al. |
| 2019/0252166 A1 | 8/2019 | Felzer et al. |

FOREIGN PATENT DOCUMENTS

| | | |
|---|---|---|
| CN | 105200393 B | 10/2018 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 6330623 B2 | 5/2018 |
| JP | 6464765 B2 | 2/2019 |
| JP | 6478847 B2 | 3/2019 |
| JP | 2019036630 B2 | 3/2019 |
| KR | 101887072 B1 | 8/2018 |
| WO | 0137317 A1 | 5/2001 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019096515 A1 | 5/2019 |
| WO | 2019096564 A1 | 5/2019 |
| WO | 2019105671 A1 | 6/2019 |

* cited by examiner

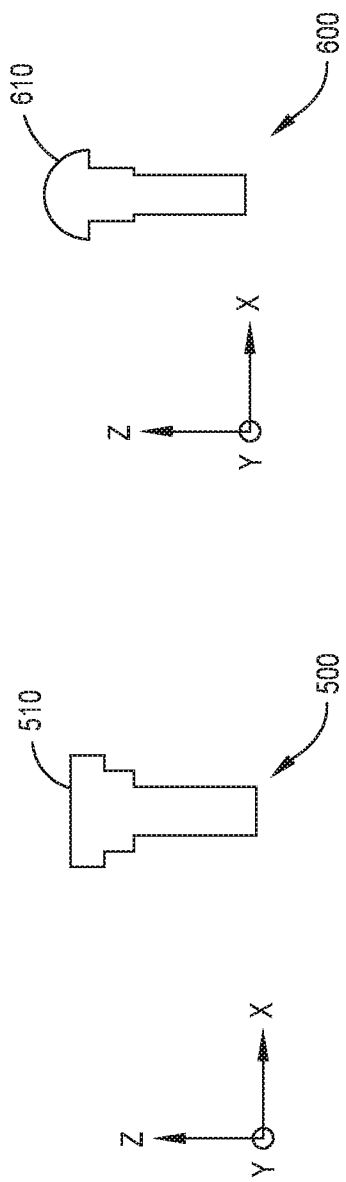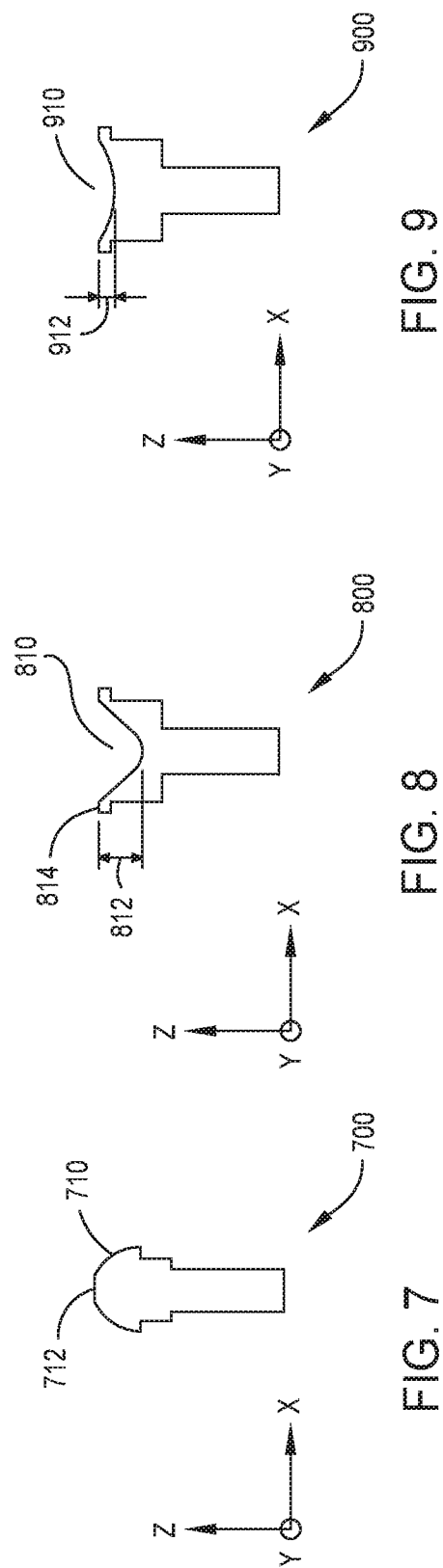

PEDESTAL ASSEMBLY FOR A SUBSTRATE PROCESSING CHAMBER

BACKGROUND

Field

Embodiments of the present disclosure generally relate to methods and apparatus for processing substrates. Embodiments of the disclosure relate to substrate processing platforms, which use multiple processing chambers for processing substrates. More particularly, embodiments of the disclosure relate to pedestal assemblies for such processing chambers.

Description of the Related Art

Conventional cluster tools are configured to perform one or more processes during substrate processing. For example, a cluster tool can include a physical vapor deposition (PVD) chamber for performing a PVD process on a substrate, an atomic layer deposition (ALD) chamber for performing an ALD process on a substrate, a chemical vapor deposition (CVD) chamber for performing a CVD process on a substrate, and/or one or more other processing chambers for performing one or more other processes on a substrate.

The aforementioned cluster tools have limitations, such as mechanical throughput, vacuum purity, and process flexibility. Therefore, what is needed in the art is a transfer apparatus for the cluster tool capable of improving the mechanical throughput, improving vacuum purity, and increasing process flexibility.

SUMMARY

In one example embodiment, a pedestal assembly for a processing region comprises a substrate support, first pins, second pins, alignment elements, and a flexible element. The first pins are coupled to the substrate support, configured to mate with first terminals of an electrostatic chuck, and are configured to be coupled to a first power source. Each of the first pins comprises an interface element, and a compliance element supporting the interface element. The second pins are coupled to the substrate support, configured to mate with second terminals of the electrostatic chuck, and configured to be coupled to a second power source. The alignment elements are coupled to the substrate support and are configured to interface with centering elements of the electrostatic chuck. The flexible element is coupled to the substrate support, configured to interface with a passageway of the electrostatic chuck, and configured to be coupled to a gas source.

In one example embodiment, a processing region comprises a sealing assembly, and a pedestal assembly configured to move between a processing position and a transfer position. The pedestal assembly comprises a substrate support, first pins, second pins, alignment elements, and a flexible element. The first pins are coupled to the substrate support, configured to mate with first terminals of an electrostatic chuck, and configured to couple to a first power source. Each of the first pins comprises an interface element, and a compliance element supporting the interface element. The second pins are coupled to the substrate support, configured to mate with second terminals of the electrostatic chuck, and configured to couple to a second power source. The alignment elements are coupled to the substrate support and are configured to interface with centering elements of the electrostatic chuck. The flexible element is coupled to the substrate support, is configured to interface with a passageway of the electrostatic chuck, and is configured couple to a gas source. When the pedestal assembly is in the processing position, a portion of the electrostatic chuck mates with a portion of the sealing assembly to form a processing volume.

In one example embodiment, a cluster tool assembly and a processing region. The cluster tool assembly comprises a central transfer apparatus comprising a transfer arm. The transfer arm comprising a first pins configured to mate with first terminals of an electrostatic chuck. The processing region comprises a pedestal assembly configured to move between a processing position and transfer position. The pedestal assembly comprises a substrate support, second pins, third pins, alignment elements, and a flexible element. The second pins are coupled to the substrate support, configured to mate with second terminals of the electrostatic chuck, and configured to couple to a first power source. Each of the second pins comprises an interface element, and a compliance element supporting the interface element. The third pins are coupled to the substrate support, configured to mate with third terminals of the electrostatic chuck, and are configured to couple to a second power source. The alignment elements coupled to the substrate support, and are configured to interface with centering elements of the electrostatic chuck. The flexible element is coupled to the substrate support, configured to interface with a passageway of the electrostatic chuck, and configured to couple to a gas source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 5, 6, 7, 8 and 9 are example pins, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the apparatus and methods, it is to be understood that the disclosure is not limited to the details of construction or process steps set forth in the following description. It is envisioned that some embodiments of the present disclosure may be combined with other embodiments.

One or more embodiments of the present disclosure are directed towards an apparatus for substrate processing and a cluster tool including a transfer apparatus and a plurality of processing regions. The transfer apparatus is configured as a carousel in some embodiments, and the processing regions may include facilities to enable atomic layer deposition (ALD), chemical vapor deposition (CVD), physical vapor deposition (PVD), etch, cleaning, heating, annealing, and/or polishing processes. Other processing platforms may also be used with the present disclosure at the discretion of a user. The present disclosure is generally meant to provide a substrate processing tool with high throughput, increased adaptability, and a smaller footprint.

In addition, in embodiments of the present disclosure a cluster tool assembly is provided in which both an electrostatic chuck and a substrate are transferred between processing chambers of the cluster tool assembly. As the electrostatic chuck and substrate are transferred into a processing chamber of the cluster tool, terminals of the electrostatic chuck mate with pins of a substrate support in the processing chamber. The pins of the substrate support provide power signals to terminals of the electrostatic chuck. Further, the pins of the substrate support are configured to support a portion of the weight of the electrostatic chuck to ensure that the connection between the pins of the substrate support and the terminals of the electrostatic chuck allows power signals to be transferred from the pins of the substrate support to the terminals of the electrostatic chuck.

Figure 1:
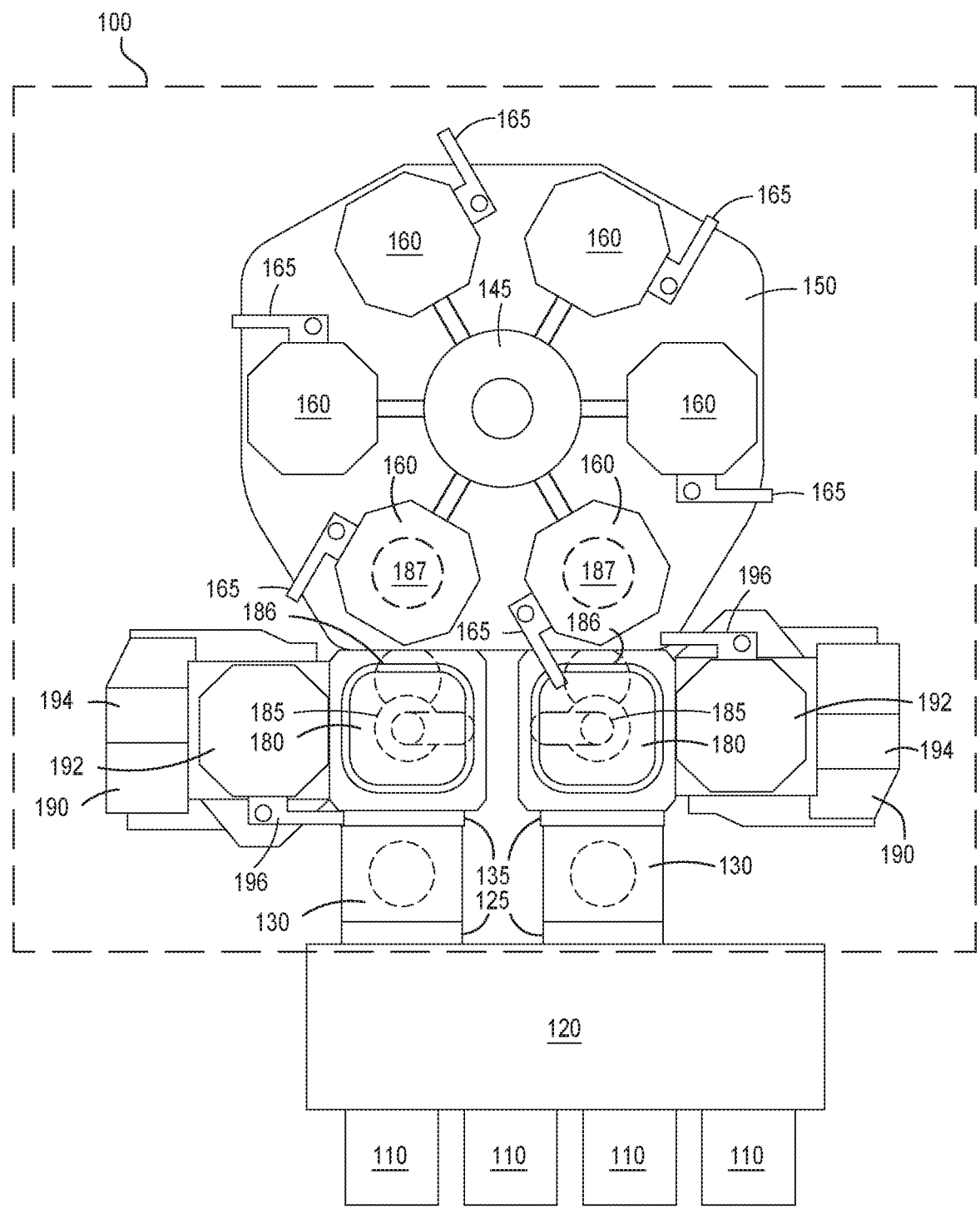
FIG. 1 is a plan view of a cluster tool assembly according to one or more embodiments.

FIG. 1 is a plan view of a cluster tool assembly 100 with a single transfer chamber assembly 150. The cluster tool assembly 100 includes a plurality of load lock chambers 130, a plurality of robot chambers 180 adjacent to the plurality of load lock chambers 130, a plurality of prep chambers 190 adjacent to the plurality of robot chambers 180, and the transfer chamber assembly 150 adjacent to the plurality of robot chambers 180. The load lock chambers 130 of the cluster tool assembly 100 are typically coupled to a plurality of Front Opening Unified Pods (FOUPs) 110 by a Factory Interface (FI) 120 adjacent to the FOUPs 110.

The plurality of FOUPs 110 may be utilized to safely secure and store substrates as the substrates are moved between different machines. The plurality of FOUPs 110 may vary in quantity depending upon the process and throughput of the system. The FI 120 is disposed between the plurality of FOUPs 110 and the plurality of load lock chambers 130. The FI 120 creates an interface between the factory and the cluster tool assembly 100. The plurality of load lock chambers 130 are connected to the FI 120 by first valves 125, such that a substrate may be transferred from the FI 120 to the plurality of load lock chambers 130 through the first valves 125 and from the plurality of load lock chambers 130 to the FI 120. As shown, the first valves 125 are on one wall of the load lock chambers 130. In some embodiments, the first valves 125 are fluid isolation valves and form a seal between the FI 120 and the load lock chambers 130. This seal may keep outside contaminants from entering the cluster tool assembly 100. The load lock chambers 130 also comprise a second valve 135 on an opposite wall from the first valve 125. The second valve 135 interfaces the load lock chambers 130 with the robot chambers 180.

The transfer chamber assembly 150 includes a central transfer apparatus 145 and a plurality of processing regions 160. The plurality of processing regions 160 are disposed around the central transfer apparatus 145, such that the plurality of processing regions 160 are disposed radially outward of the central transfer apparatus 145 in the transfer chamber assembly 150.

As shown, the robot chambers 180 are on one side of the load lock chambers 130, such that the load lock chambers 130 are between the FI 120 and the robot chambers 180. The robot chambers 180 include a transfer robot 185. The transfer robot 185 may be any robot suitable to transfer one or more substrates from one chamber to another. The transfer robot 185 is utilized to transfer substrates 186 to an electrostatic chuck (e.g., electrostatic chuck) 187 that is temporarily connected to the central transfer apparatus 145. The connection between the electrostatic chuck 187 and the central transfer apparatus 145 is described below in more detail. The electrostatic chuck 187 holds a single substrate 186 and travels with the substrate 186 into each of the processing regions 160. The electrostatic chuck 187, when in one of the processing regions 160 (with a substrate thereon), forms a boundary of the processing region 160. The substrates 186 are mated with one electrostatic chuck 187, and the substrate 186 moves in and between the processing regions 160 on that electrostatic chuck 187.

In some embodiments, the transfer robot 185 is configured to transport substrates 186 from the load lock chambers 130 and into the plurality of prep chambers 190. The transfer robot 185 removes the substrate 186 from the load lock chambers 130, moves the substrate 186 into the robot chamber 180, and then moves the substrate 186 into the prep chamber 190. The transfer robot 185 is also be configured to move substrates 186 to the transfer chamber assembly 150. Similarly to how the substrate 186 may be moved to the prep chambers 190 from the load lock chambers 130 by the transfer robot 185, the substrate 186 may also be moved from the prep chamber 190 to the load lock chambers 130 by the transfer robot 185. The transfer robot 185 may also move substrates 186 from the transfer chamber assembly 150 to the prep chambers 190 or the load lock chambers 130. In some alternative embodiments, the transfer robot 185 may move a substrate 186 from the load lock chambers 130, move the substrate 186 into the robot chamber 180, and then move the substrate 186 into the transfer chamber assembly 150. In this alternative embodiment, the substrate 186 may not enter the prep chamber 190 either before processing in the transfer chamber assembly 150 or after processing in the transfer chamber assembly 150.

The prep chambers 190 include a cleaning chamber 192, a packaging structure 194, and a cleaning chamber vacuum pump 196. The cleaning chamber 192 may be any one of a pre-clean chamber, an anneal chamber, or a cool down chamber, depending upon the desired process within the cluster tool assembly 100. In some embodiments, the cleaning chamber 192 is a wet clean chamber. In other embodiments, the cleaning chamber 192 is a plasma clean chamber. In yet other exemplary embodiments, the cleaning chamber 192 is a Preclean II chamber available from Applied Materials, Inc., of Santa Clara, Calif.

The packaging structure 194 may be a structural support for the cleaning chamber 192. The packaging structure 194 may include a sub-transfer chamber (not shown), a gas supply (not shown), and an exhaust port (not shown). The packaging structure 194 may provide the structure around the cleaning chamber 192 and interface the cleaning chamber 192 to the robot chamber 180. The cleaning chamber vacuum pump 196 is disposed adjacent to a wall of the cleaning chamber 192 and provides control of the pressure within the cleaning chamber 192. One cleaning chamber vacuum pump 196 may be adjacent to each of the cleaning chambers 192. The cleaning chamber vacuum pump 196 may be configured to provide a pressure change to the cleaning chamber 192. In some embodiments, the cleaning chamber vacuum pump 196 is configured to increase the pressure of the cleaning chamber 192. In other embodiments, the cleaning chamber vacuum pump 196 is configured to decrease the pressure of the cleaning chamber 192, such as to create a vacuum within the cleaning chamber 192. In yet other embodiments, the cleaning chamber vacuum pump 196 is configured to both increase and decrease the pressure of the cleaning chamber 192 depending on the process being utilized within the cluster tool assembly 100. The cleaning chamber vacuum pump 196 may be held in place by the packaging structure 194, such that the packaging structure 194 at least partially surrounds the cleaning chamber vacuum pump 196.

The load lock chambers 130, robot chambers 180, and prep chambers 190 may be arranged to reduce the footprint required for the cluster tool assembly 100. In one embodiment, one load lock chamber 130 is attached to a first wall of the robot chamber 180. One prep chamber 190 is attached to a second wall of the robot chamber 180. The first and second walls may be adjacent walls on the robot chamber 180. In some embodiments, the robot chamber 180 is roughly square shaped. In other embodiments, the robot chamber 180 is a quadrilateral. In yet other embodiments, the robot chambers 180 may be any desired shape, such as a polygon or a round shape, such as a circle. In an embodiment where the robot chambers 180 are a square or quadrilateral shape, the first wall and the second wall may be adjacent walls, such that the two walls intersect each other. As shown in FIG. 1, the cluster tool assembly 100 includes two load lock chambers 130, two robot chambers 180, and two cleaning chambers 190. The two load lock chambers 130, two robot chambers 180, and two cleaning chambers 190, when arranged as described above, form two transport assemblies. The two transport assemblies are spaced apart from each other and form mirror images of one another, such that the prep chambers 190 are on opposite walls of their respective robot chambers 180.

As shown, the transfer chamber assembly 150 is adjacent to the robot chambers 180, such that the transfer chamber assembly 150 is connected to the robot chambers 180 by a valve (not shown). The transfer chamber assembly 150 may be attached to a third wall of the robot chambers 180. The third wall of the robot chambers 180 may be opposite the first wall of the robot chambers 180.

A chamber pump 165 is disposed adjacent to each of the processing regions 160, such that a plurality of chamber pumps 165 are disposed around the central transfer apparatus 145. The plurality of chamber pumps 165 may also be disposed radially outward of the central transfer apparatus 145 in the transfer chamber assembly 150. One chamber pump 165 for each of the processing regions 160 is provided, such that one chamber pump 165 is connected to each of the processing regions 160. In some embodiments, multiple chamber pumps 165 per processing region 160 are provided. In yet other embodiments, a processing region 160 may not have a chamber pump 165. A varying number of chamber pumps 165 per processing region 160 may be provided, such that one or more processing regions 160 may have a different number of chamber pumps 165 than a separate set of processing regions 160. In some embodiments, the chamber pumps 165 are configured to increase the pressure of the processing region 160. In other embodiments, the chamber pumps 196 are configured to decrease the pressure of the processing region 160, such as to create a vacuum within the processing region 160. In yet other embodiments, the chamber pumps 165 are configured to both increase and decrease the pressure of the processing regions 160 depending on the process being utilized within the cluster tool assembly 100.

In the embodiment shown in FIG. 1, the transfer chamber assembly 150 includes six processing regions 160. In one embodiment, the transfer chamber assembly 150 includes a single processing region 160. In another embodiment, two or more processing regions 160 are provided. In some embodiments two to twelve processing regions 160 are within the transfer chamber assembly 150. In other embodiments, four to eight processing regions 160 are within the transfer chamber assembly 150. The number of processing regions 160 impacts the total footprint of the cluster tool assembly 100, the number of possible process steps capable of being performed by the cluster tool assembly 100, the total fabrication cost of the cluster tool assembly 100, and the throughput of the cluster tool assembly 100.

The plurality of processing regions 160 can be any one of PVD, CVD, ALD, etch, cleaning, heating, annealing, and/or polishing platforms. In some embodiments, the plurality of processing regions 160 can all be similar platforms. In other embodiments, the plurality of processing regions 160 can include two or more types of processing platforms. In one exemplary embodiment, all of the plurality of processing regions 160 are PVD process chambers. In another exemplary embodiment, the plurality of processing regions 160 includes both PVD and CVD process chambers. Other embodiments of the makeup of the plurality of processing regions 160 are envisioned. The plurality of processing regions 160 can be altered to match the types of process chambers needed to complete a process.

The central transfer apparatus 145 is disposed in the center of the transfer chamber assembly 150, such that the central transfer apparatus 145 is disposed around a central axis of the transfer chamber assembly 150. The central transfer apparatus 145, may be any suitable transfer device. The central transfer apparatus 145 is configured to transport a substrate 186 on an electrostatic chuck 187 to and from each of the processing regions 160. In one embodiment, the central transfer apparatus 145 is configured as a carousel system.

Figure 2A:
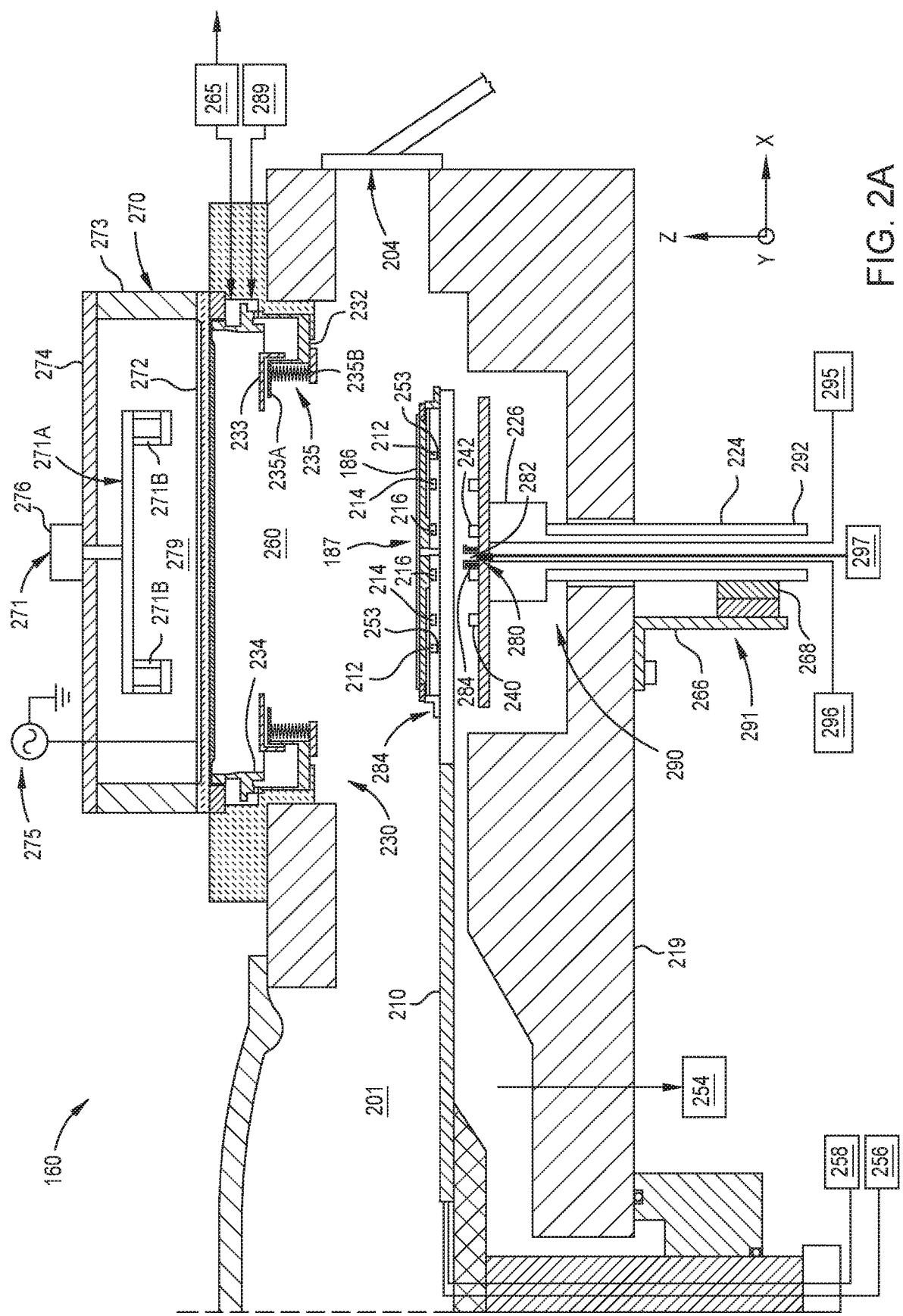
FIGS. 2A and 2B are side views of a processing chamber, according to one or more embodiments.
Figure 2B:
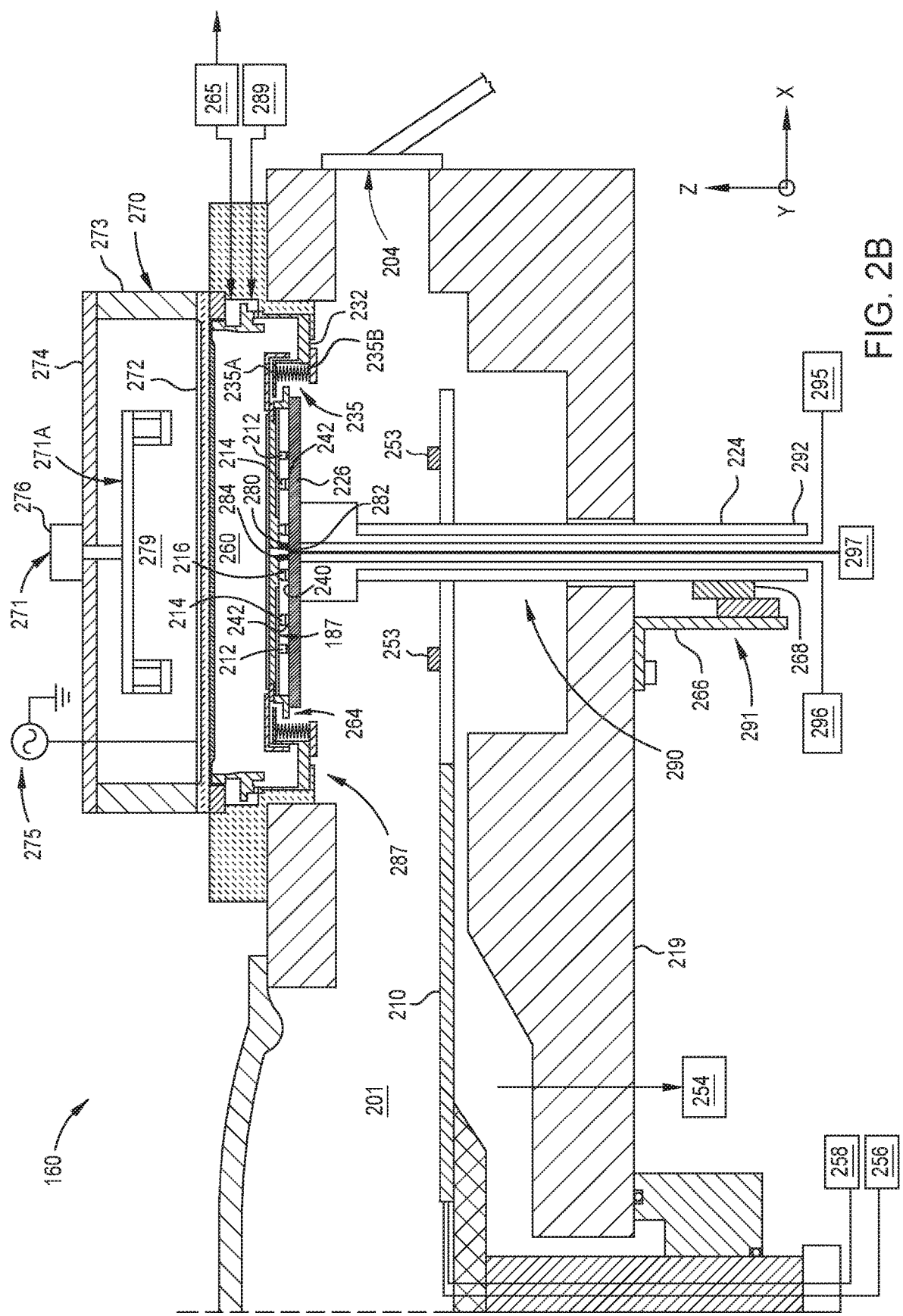

As shown in FIGS. 2A and 2B, a processing region 160 is serviced via a central transfer apparatus (e.g., the central transfer apparatus 145 of FIG. 1) to transfer electrostatic chucks (e.g., the electrostatic chuck 187) and substrates (e.g., the substrate 186) into and out of the processing region 160. A substrate transfer opening 204 extends inwardly of the outer surface of a circumferential wall of the processing region 160 and into a transfer region 201 of the processing region 160. The transfer opening 204 allows the transfer robot 185, to transfer the substrate 186 into and out of the transfer region 201. In various embodiments, the transfer opening 204 may be omitted. For example, in embodiments where the processing region 160 does not interface with the transfer robot 185, the transfer opening 204 may be omitted.

A source assembly 270 of the processing region 160 is configured to perform a deposition process (e.g., a PVD deposition process or the like). In this configuration, the source assembly 270 includes a target 272, a magnetron assembly 271, a source assembly wall 273, a lid 274, and a sputtering power supply 275. The magnetron assembly 271 includes a magnetron region 279 in which the magnetron 271A is rotated by use of a magnetron rotation motor 276 during processing. The target 272 and magnetron assembly 271 are typically cooled by the delivery of a cooling fluid (e.g., DI water) to the magnetron region 279 from a fluid recirculation device (not shown). The magnetron 271A includes a plurality of magnets 271B that are configured to generate magnetic fields that extend below the lower surface of the target 272 to promote a sputtering process in the processing volume 260 during a PVD deposition process.

Alternate configurations of the processing region 160, which are adapted to perform CVD, PECVD, ALD, PEALD, etch, or thermal processes, the source assembly 270 generally include different hardware components. In one example, the source assembly 270 of a processing station that is adapted to perform a PECVD deposition process or etch process includes a gas distribution plate, or showerhead, that is configured to deliver a precursor gas or etching gas into the processing volume 260 and across a surface of a substrate disposed within the processing region 160 during processing. In this case, the magnetron assembly 271 and target are not used, and the sputtering power supply 275 is replaced with an RF power supply that is configured to bias the gas distribution plate.

A substrate support actuation assembly 290 includes a pedestal lift assembly 291 and a pedestal assembly 224. The pedestal lift assembly 291 includes a lift actuator assembly 268 and a lift mounting assembly 266, which is coupled to the base 219 of the processing region 160. During operation the lift actuator assembly 268 and lift mounting assembly 266 are configured to position the pedestal assembly 224 in at least a transfer position (FIG. 2A), which is positioned vertically (in the Z direction) below a transfer arm 210 of the central transfer apparatus 145 (i.e., transfer plane), and a processing position (FIG. 2B), which is vertically above the transfer arm 210. Further, the lift actuator assembly 268 and the lift mounting assembly 266 apply vertical motion, in the +Z direction, to the pedestal assembly 224 to pick the electrostatic chuck 187 off of the transfer arm 210. Additionally, the lift actuator assembly 268 and the lift mounting assembly 266 apply vertical motion, in the −Z direction, to the pedestal assembly 224 to position the electrostatic chuck 187 on the transfer arm 210.

The lift actuator assembly 268 is coupled to a pedestal shaft 292, which is supported by bearings (not shown) that are coupled to a base 219 of the transfer chamber assembly 150 to guide the pedestal shaft 292 as it is translated by the lift actuator assembly 268. A bellows assembly (not shown) is used to form a seal between the outer diameter of the pedestal shaft 292 and a portion of the base 219, such that a vacuum environment created within the transfer region 201 by use of a pump 254 is maintained during normal operation.

The pedestal assembly 224 includes a substrate support 226 that is coupled to the pedestal shaft 292. The pedestal assembly 224 includes a heater power source 295, an electrostatic chuck power source 296 and a backside gas source 297. The substrate support 226 supports the electrostatic chuck 187 and the substrate 186 within the processing region 160.

The substrate support 226 comprises pins 240 and 242. The pins 240 are coupled to the heater power source 295. The pedestal assembly 224 includes two or more pins 240. Further, the pins 240 are configured to mate (e.g., physically and electrically couple) with terminals 214 of the electrostatic chuck 187. The heater power source 295 provides an AC power signal or signals. The heater power source 295 provides an AC power signal having a current in a range of about 20 A to about 30 A to the pins 240 which is provided to the heating elements (e.g., heating elements 372 of FIG. 3) via the terminals 214 when the pins 240 are mated with the terminals 214. In other embodiments, the heater power source 295 provides an AC power signal having a current of less than 20 A, or greater than 30 A.

The pins 242 of the substrate support 226 mate with terminals 216 of the electrostatic chuck 187. The substrate support 226 includes two or more pins 242. In such embodiments, each of the pins 242 is configured to couple to a different one of the terminals 216. For example, a first one of the pins 242 is configured to couple to a first one of the terminals 216 and a second of the pins 242 is configured to couple to a second one of the terminals 216. The pins 242 are coupled to the electrostatic chuck power source 296.

The electrostatic chuck power source 296 provides DC power signals to the pins 242. The pins 242 couple the DC power signals to the terminals 216 and to chucking electrodes (e.g., the chucking electrodes 370 of FIG. 3) when the pins 242 are mated with the terminals 216 to electrically chuck the substrate 186 to the electrostatic chuck 187. In one embodiment, the electrostatic chuck power source 296 provides a positive DC power signal to a first one of the pins 242 and a negative DC power signal to a second one of the pins 242 to electrically chuck the substrate 186 to the electrostatic chuck 187. The DC power signals drive the pins 242, the terminals 212, and the chucking electrodes 370 in a bi-polar configuration such that a first DC power signal is positive and a second DC power signal is negative. The magnitudes of the DC power signals may be the same. For example, the first DC power signal is about 1500 V and the second DC power signal is about −1500 V. Alternatively, the DC power signals have a magnitude greater than or less than about 1500 V. In other embodiments, the magnitude of a first one of the DC power signals differs from the magnitude of a second one of the DC power signals.

The pins 240 and 242 are removably coupled or non-removably (or permanently) coupled to the pedestal assembly 224. For example, in one embodiment, the pins 240 and/or 242 are removably coupled and may be attached and removed from the pedestal assembly 224 such that the pins 240 and/or 242 may be replaced without damaging the pedestal assembly 224. The contact between the pins 240 and 242 and the terminals 214 and 212 causes wear to the pins 240 and 242. Over time, the pins 240 and 242 may need to be replaced. Removably coupling the pins 240 and 242 to the pedestal assembly 224 allows the pins 240 and 242 to be removed and replaced when wear affects the operation of the pins 240 and/or 242 and degrades the coupling between the pins 240, 242 and the terminals 214, 212.

The pedestal assembly 224 includes flexible element 280. The flexible element 280 includes a passageway 282 and bellows 284. The flexible element 280 is configured to generate a seal against a bottom surface of the electrostatic chuck 187. A backside gas is provided via the backside gas source 297 to the passageway 282 of the flexible element 280. The backside gas flows through the passageway 282 into the space between the substrate 186 and the electrostatic chuck 187 to improve the uniformity of the thermal conductivity between the substrate 186 and the electrostatic chuck 187, improving the uniformity of the deposition of materials onto the substrate 186. The backside gas may be nitrogen, helium, or argon, among others.

A process kit assembly 230 generally includes a process region shield 232 and a sealing assembly 235. A station wall 234 includes a first port that is coupled to a vacuum pump 265 and is configured to evacuate a processing volume 260 through a circumferential gap formed between an upper portion of the shield 232, lower surface of the target 272 and a portion of an isolation ring 233 and station wall 234 during processing. The station wall 234 is coupled to a gas source assembly 289, and is configured to deliver one or more process gases (e.g., Ar, $N_2$) to the processing volume 260 through a circumferential plenum during processing.

During processing of a substrate, e.g., FIG. 2B, the substrate 186 and the electrostatic chuck 187 are positioned in a processing position below the source assembly 270. When in the processing position a region 284 of the electrostatic chuck 187 forms a "seal" with a portion of the sealing assembly 235 so as to substantially fluidly isolate the processing volume 260 from the transfer region 201. Thus, in the processing position, the electrostatic chuck 187, the sealing assembly 235, the process region shield 232, the station wall 234, the isolation ring 233 and target 272 substantially enclose and define the processing volume 260. In some embodiments, the "seal" formed between the portion of the electrostatic chuck 187 and an upper plate 235a of the sealing assembly 235 is created at a sealing region that is formed by physical contact between a surface of the region 264 of the electrostatic chuck 187 and a surface of the upper plate 235a. In some embodiments, a flexible bellows assembly 235b of the sealing assembly 235 is configured to be extended in the vertical direction as the portion of the electrostatic chuck 187 is placed in contact with the surface of the portion of the sealing assembly 235 by use of the lift actuator assembly 268 in the substrate support actuation assembly 290. The compliant nature of the flexible bellows assembly allows any misalignment or planarity differences between the surface of the portion of the electrostatic chuck 187 and the surface of the portion of the sealing assembly 235 to be taken up so that a reliable and repeatable seal can be formed at the region 264. The flexible bellows assembly 235b may be a stainless steel bellows assembly or Inconel bellows assembly, among others.

Figure 3:
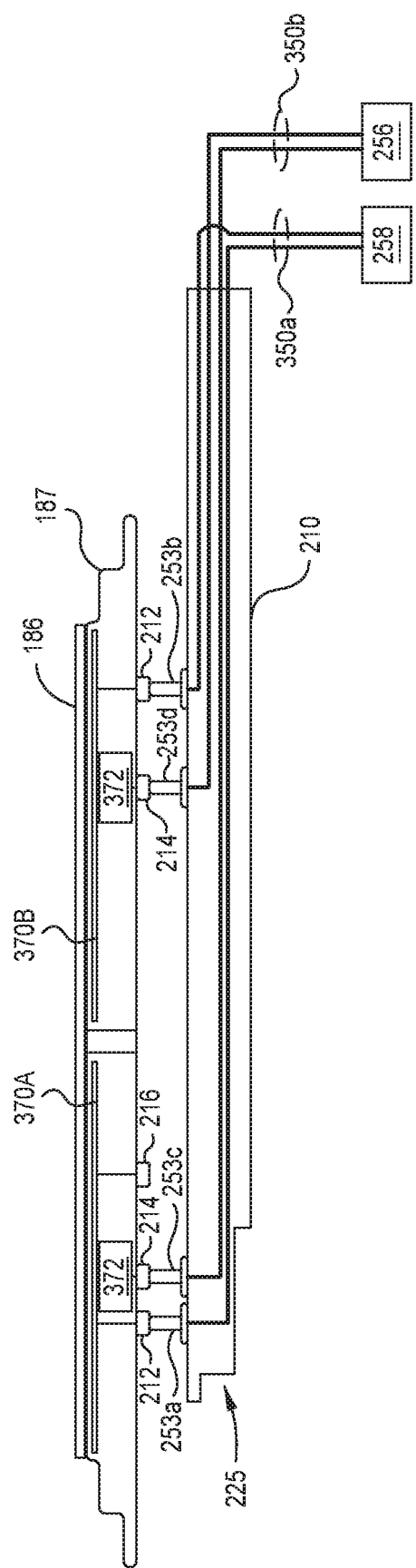
FIG. 3 illustrates a transfer arm, an electrostatic chuck, and a substrate, according to one or more embodiments.

FIG. 3 is a schematic sectional side view of a portion of one of the transfer arms 210 of the central transfer apparatus 145. Electrical contacts 253 are at a second end 225 of the transfer arm 210. Also shown is the electrostatic chuck 187 supported by the electrical contact 253. A substrate 186 is shown attached to the electrostatic chuck 187.

Each of the electrical contacts 253 may be shaped as a protruding member or pin. The electrical contacts 253a and 253b contact and form an electrical connection with the terminals 212 of the electrostatic chuck 187. Additionally, or alternatively, the electrical contacts 253c and 253d contact and form an electrical connection with one or more of the terminals 214. In one or more embodiments, the electrical contacts 253c and 253d are omitted such that the transfer arm 210 includes the electrical interface connects 253a and 253b, and not the electrical contacts 253c and 253d.

The electrical contacts 253 provide electrical power to an electrical component or components within the electrostatic chuck 187 while the electrostatic chuck 187 and substrate 186 are supported by the transfer arm 210. For example, the electrical contacts 253a and 253b are coupled to a power supply 258 that provides DC signals, e.g., a DC power supply, via connections 350a. The DC signals are supplied to the chucking electrodes (e.g., chucking electrodes 370 of FIGS. 3 and 4) via the electrical connection between the electrical contacts 253a, 253b and the terminals 212. A first one of the DC signals has a positive polarity and a second one of the DC signals has a negative polarity. Further, the magnitude of the DC signals are substantially similar (e.g., within five percent of each other). For example, the magnitude of the DC signals is about 1500 V. Alternatively, the magnitude of the DC signals is less than or greater than about 1500 V. Driving the chucking electrodes 370 with the DC signals generates an electrical chucking force that holds the substrate 186 to the surface of the electrostatic chuck 187.

The power supply 256 provides an alternating current (AC) signal or signals that is provided to the heating elements (e.g., heating elements 372 of FIGS. 3 and 4) via the electrical connection between an electrical contact 253 and a terminal 214. The power supply 256 is connected to the electrical contacts 253c and 253d via connections 350b. The power supply 256 may be referred to as an AC power supply. The AC signal provides a current of about 30 A. Alternatively, the AC signal provides a current of less than or greater than 30 A. The AC signal or signals are converted by the heating elements 372 into heat that thermally couples with the substrate 186.

The connections (conductors) 350 are routed through an internal region of the transfer arm 210 to connect with the respective ones of the electrical contacts 253.

Figure 4:
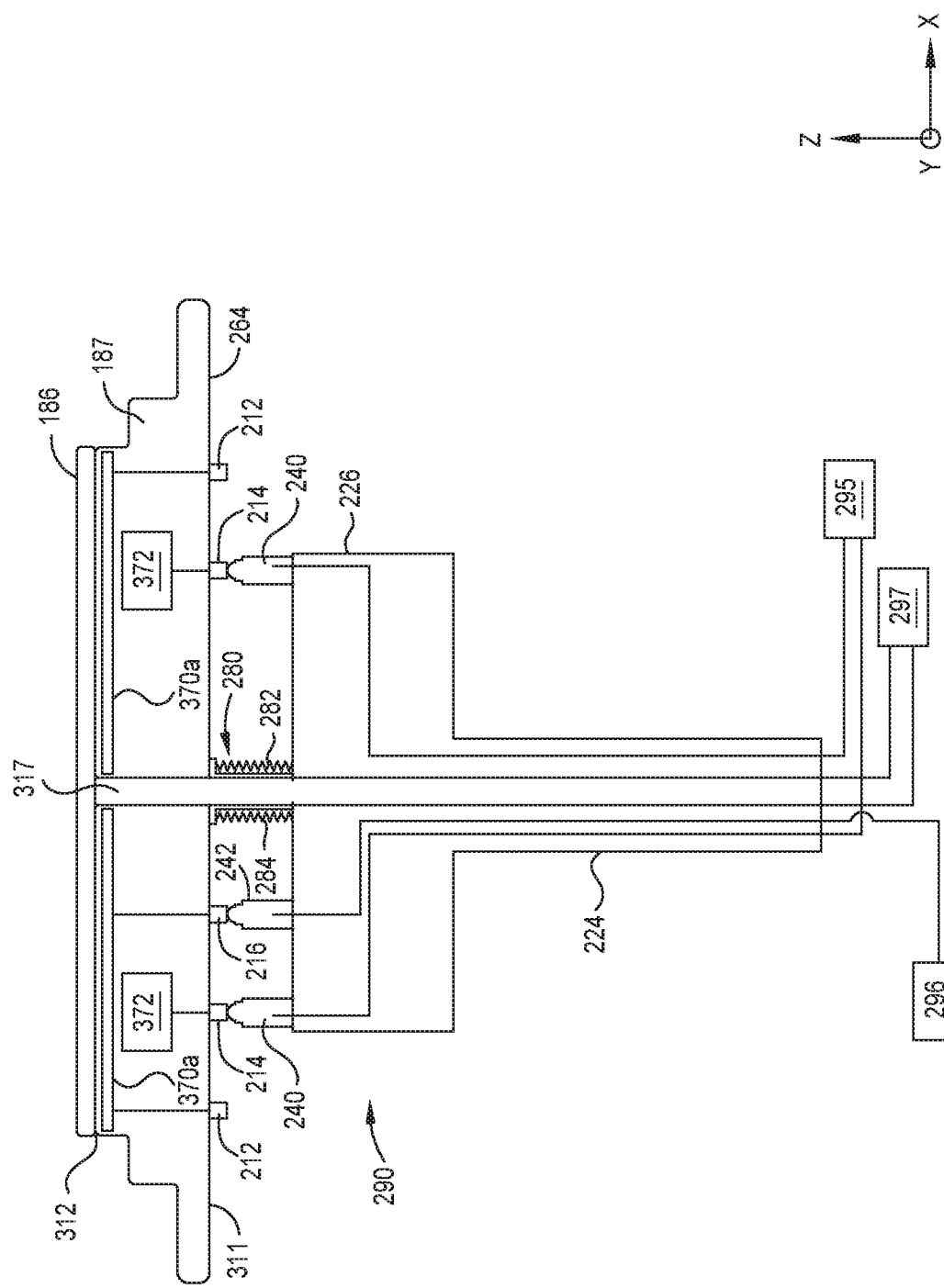
FIG. 4 illustrates a substrate support, an electrostatic chuck, and a substrate, according to one or more embodiments.

FIG. 4 illustrates a portion of the pedestal assembly 224, the electrostatic chuck 187, and the substrate 186. In the embodiment of FIG. 4, substrate support 226 has pins 240 and 242 that are coupled to terminals 214 and 216, respectively. The pins 240 receive an AC power signal from heater power source 295 and couple the AC power signal to the terminals 214. The terminals 214 are connected to the heating elements 372 and receive the AC power signal from the terminals 214. The heating elements 372 generate heat from the AC power signals which is thermally coupled to the substrate 186.

The pins 242 of the substrate support 226 mate with the terminals 216 of the electrostatic chuck 187 and couple DC power signals to the terminals 216 from the power source 296. The DC power signals are communicated from the terminals 216 to the chucking electrodes 370 to electrostatic chuck the substrate 186 to the surface of the electrostatic chuck 187. First and second DC power signals are driven onto the terminals 216 such that a first DC power signal is driven onto chucking electrode 370A or 370B and a second DC power signal is driven on the other one of the chucking electrode 370A or 370B. The first and second DC power signals have a similar magnitude but differ in polarity.

The flexible element 280 forces a seal with the surface 311 of the electrostatic chuck 187 such that a backside gas may be provided into the space or spaces between the substrate 186 and the surface 312 of the electrostatic chuck 187 via the passageway 317 of the electrostatic chuck 187. The passageway 317 is fluidly coupled with the passageway 282. The backside gas improves the thermal coupling between the electrostatic chuck 187 and the substrate 186, increasing the uniformity of thermal coupling between the electrostatic chuck 187 and the substrate 186, improving the process uniformity on the substrate 186.

FIG. 5 illustrates an example pin 500, according to one or more embodiments. One or more of the pins 240 and 242 may be configured similar to that of the pin 500 such that the surface of one or more of the pins 240 and 242 have a substantially flat surface 510. The surface 510 is substantially flat such that the surface 510 does not significantly vary in the +Z or −Z direction.

FIG. 6 illustrates an example pin 600, according to one or more embodiments. One or more of the pins 240 and 242 may be configured similar to that of the pin 600. The pin 600 includes a convex surface 610. The convex surface 610 has a radius of about 5 mm to about 20 mm. Alternatively, the convex surface 610 may have a radius of less than 5 mm or greater than 20 mm.

FIG. 7 illustrates an example pin 700, according to one or more embodiments. One or more of the pins 240 and 242 may be configured similar to that of the pin 600. The surface of the pin 600 includes a convex portion 710. The convex portion 710 has a radius of about 5 mm to about 20 mm. Alternatively, the convex portion 710 may have a radius of less than 5 mm or greater than 20 mm. Further, the convex portion 710 includes a flat portion 712 in a central area of the convex portion 710.

FIG. 8 illustrates an example pin 800, according to one or more embodiments. One or more of the pins 240 and 242 may be configured similar to that of the pin 800. The surface of the pin 800 includes a groove 810. The groove 810 has a depth of 812 from the surface 814 of the pin 800 in the −Z direction. The depth 812 allows a portion (e.g., at least a tip) of a terminal (e.g., the terminal 212, 214, and/or 216) to contact the internal inclined surfaces of the groove 810.

FIG. 9 illustrates an example pin 900, according to one or more embodiments. One or more of the pins 240 and 242 may be configured similar to that of the pin 900. The surface of the pin 900 includes concave portion 910. The concave portion 910 has a radius of 912. The concave portion 910 has a radius 912 of about 5 mm to about 20 mm. Alternatively, the concave portion 910 may have a radius of less than 5 mm or greater than 20 mm.

The pins 500, 600, 700, 800, and/or 900 may be comprised of molybdenum (Mo) or tungsten (W), or a combination thereof. Alternatively, the pins 500, 600, 700, 800, and/or 900 may be comprised of a material other than Mo or W, or a combination of materials including or not including Mo and W. Further, the pins 500, 600, 700, 800, and/or 900 has a surface roughness in a range of about 2 Ra to about 6 Ra. Alternatively, the pins 500, 600, 700, 800, and/or 900 may have a surface roughness of less than 2 Ra or greater than about 6 Ra.

The terminals 212, 214, and 216 and the pins 240 and 242 may be comprised of similar materials or different materials. For example, the terminals 212, 214, and 216 and the pins 240 and 242 may be formed of a first material (e.g., Mo or W, among others). Alternatively, the terminals 212, 214, and 216 are formed from a first material or materials and the pins 240 and 242 are formed from a second material or materials.

The terminals 212, 214, and 216 and the pins 240 and 242 may have a similar shape. For example, the terminals 212, 214, and 216 and the pins 240 and 242 have a common one of a flat, a convex, concave, and a grooved shape. In other embodiments, the terminals 212, 214, and 216 have one of a flat, convex, concave, and a grooved shape and the pins 240 and 242 have a different one of a flat, convex, concave, and a grooved shape. In one example embodiment, the terminals 212, 214, 216 have a flat shape and the pins 240, 242 have a convex shape.

Figure 10:
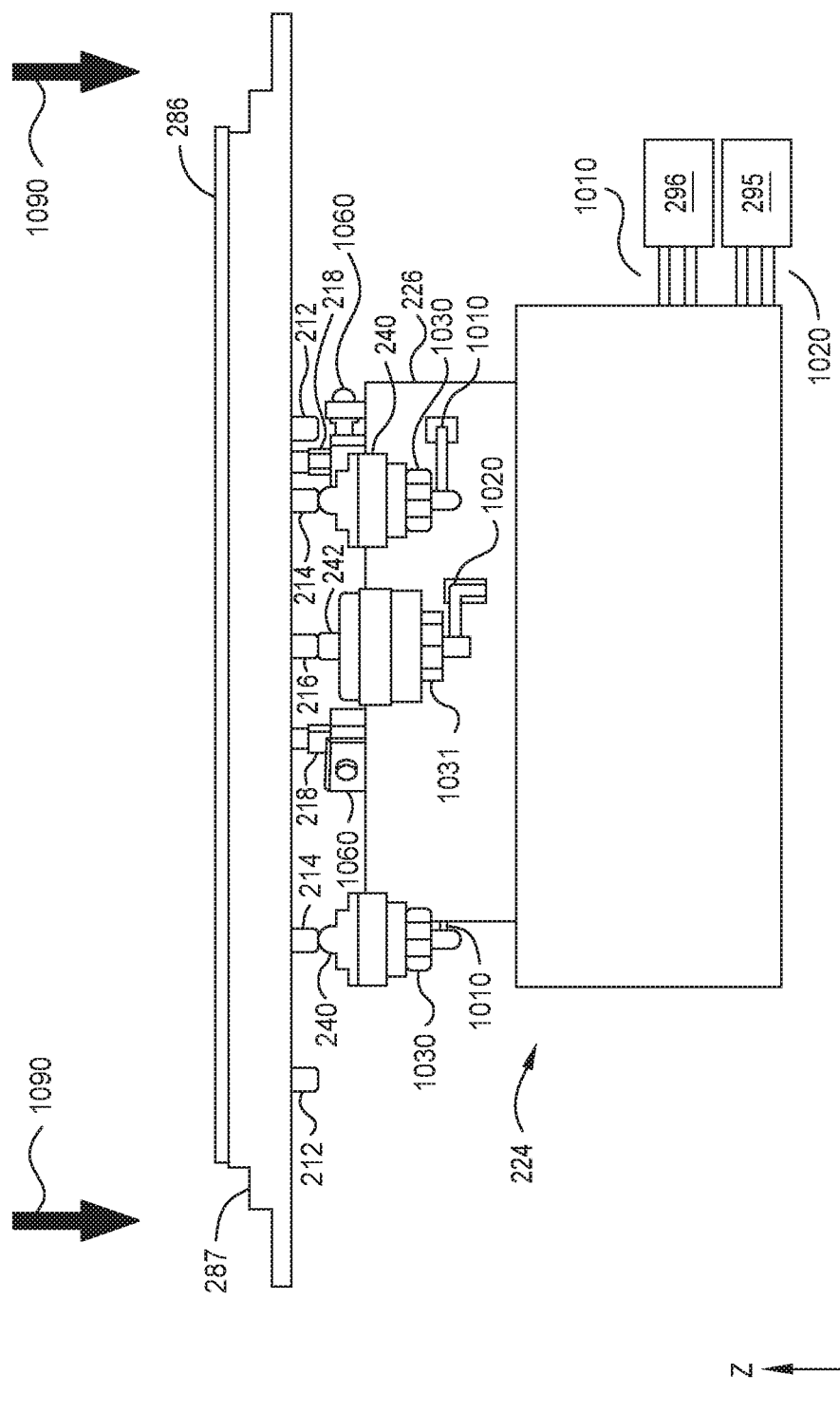
FIG. 10 illustrates a substrate support, an electrostatic chuck, and a substrate, according to one or more embodiments.

FIG. 10 is a schematic illustration of the substrate support 226 and the electrostatic chuck 287, according to one or more embodiments. As illustrated in FIG. 10, the pins 240 are coupled to a power source (e.g., the power source 296) via traces 1010. Further, the pins 242 are coupled to a power source (e.g., the power source 295) via the traces 1020. The traces 1010 and 1020 may be routed through an internal region of the pedestal assembly 224.

The pins 240 are secured to the substrate support 226 via fasteners 1030, and the pins 242 are secured to the substrate support 226 via fasteners 1031. The fasteners 1030 and 1031 may be a nut or similar type of fastener device. In one embodiment, the fasteners 1030 and 1031 may be removed such that the pins 240 and 242 may be replaced. For example, removing the fastener 1030 allows the pins 240 to be removed and a new pin 240 coupled to the substrate support 226 via the fastener 1030. Further, removing the fastener 1031 allows the pins 242 to be removed and a new pin 242 coupled to the substrate support 226 via the fastener 1031.

Figure 11:
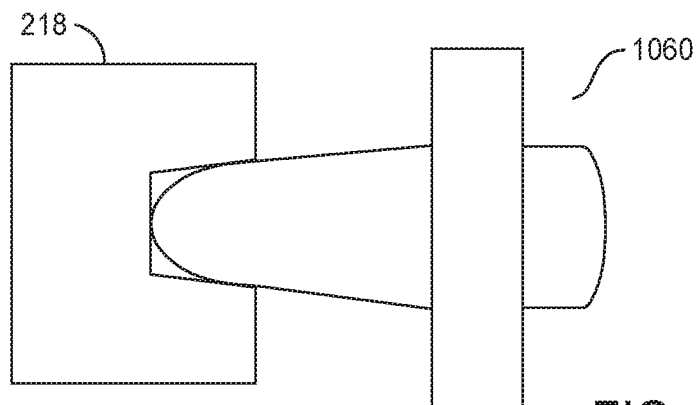
FIG. 11 illustrates an alignment element of an electrostatic chuck and a centering element of a substrate support, according to one or more embodiments.

FIG. 11 illustrates the interface between an alignment element 1060 of the substrate support 226 and a centering element 218 of the electrostatic chuck 287. When the electrostatic chuck 287 is positioned on the substrate support 226, each of the centering elements 218 of the electrostatic chuck 287 interfaces with one of the alignment elements 1060, centering the electrostatic chuck 287 over the substrate support 226. Utilizing the alignment elements 1060 and the centering elements 218 centers the electrostatic chuck 287 with the substrate support 226 and aligns the passageway 282 with the passageway 317 of the electrostatic chuck 287. Centering the electrostatic chuck 287 with the substrate support 226 aligns the flexible element 280 with the passageway 317, the terminals 214 with the pins 240 and the terminals 216 with the pins 242.

Figure 12:
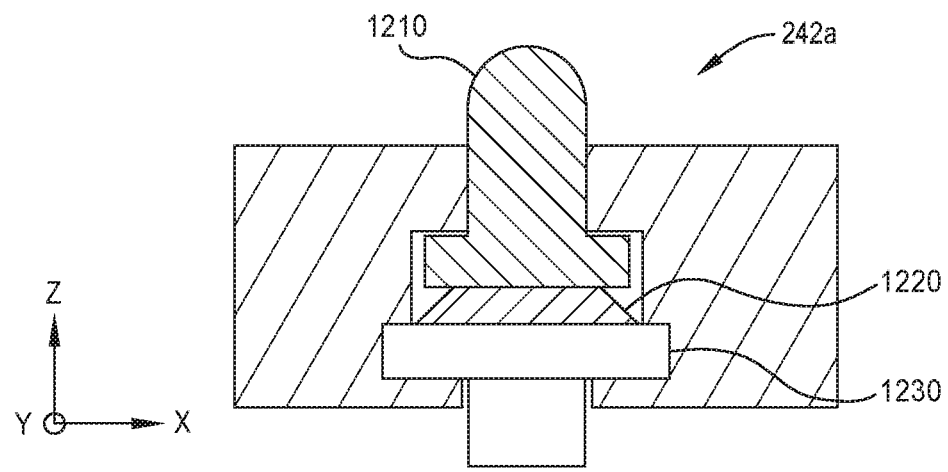
FIGS. 12 and 13 are side views of pins of a substrate support, according to one or more embodiments.

The pins 240 include one or more compliance elements. For example, as illustrated in FIG. 12, the pin 242a comprises an interface element 1210, a compliance element 1220, and a base 1230. The compliance element 1220 is positioned on the base 1230 and supports the interface element 1210, controlling the movement of the interface element 1210 in the Z direction. For example, in response to an external force, the compliance element 1220 allows interface element 1210 to travel in the −Z direction in response to a force (e.g., the force 1090 in FIG. 10). The compliance element 1220 controls the amount that the interface element 1210 travels in the −Z direction and returns the interface element 1210 to a starting point when a force (e.g., the force 1090) is removed. Each of the pins 240 includes an interface element 1210, a compliance element 1220, and a base 1230 as well. Further, the compliance element 1220 for each pin 240 may be configured similarly, or one or more of the compliance elements 1220 may be configured differently from a second one or more compliance element 1220. For example, in one or more embodiments, each of the compliance elements 1220 allows the corresponding interface element 1210 to travel the same distance in the −Z direction in response to a common amount of force. Alternatively, a first one or more of the compliance elements 1220 is more restrictive regarding the movement of a corresponding interface element 1210 in the −Z direction than a second one or more of the compliance elements 1220.

As illustrated in FIG. 10, the electrostatic chuck 287 and the substrate 286 apply a force 1090 to the pins 240 and 242, and the flexible element (e.g., the flexible element 280 of FIG. 4) of the substrate support 226. At least a portion of the force 1090 generates the coupling between the pins 240, 242 and the terminals 214, 216. Further, at least a portion of the force 1090 generates the coupling between the flexible element 280 and the electrostatic chuck 287. The force 1090 is the combined weight of the electrostatic chuck 287 and the substrate 286. The weight of the electrostatic chuck 287 and the substrate 286 may be in a range of about 4 lb. to about 8 lb. Alternatively, the weight of the electrostatic chuck 287 and the substrate 286 may be less than about 4 lb. or greater than 8 lb.

The compliance element 1220 controls the distance that interface element 1210 travels in the −Z direction is response to receiving the electrostatic chuck 287 and the substrate 286. For example, the compliance element 1220 controls the movement of the interface element 1210 in the −Z direction such that that each of the pins 240 and 242 are sufficiently coupled with a corresponding one of the terminals 214 and 216 and AC or DC power signals may be driven onto the terminals 214 and 216 form corresponding ones of the pins 240 and 242.

Figure 13:
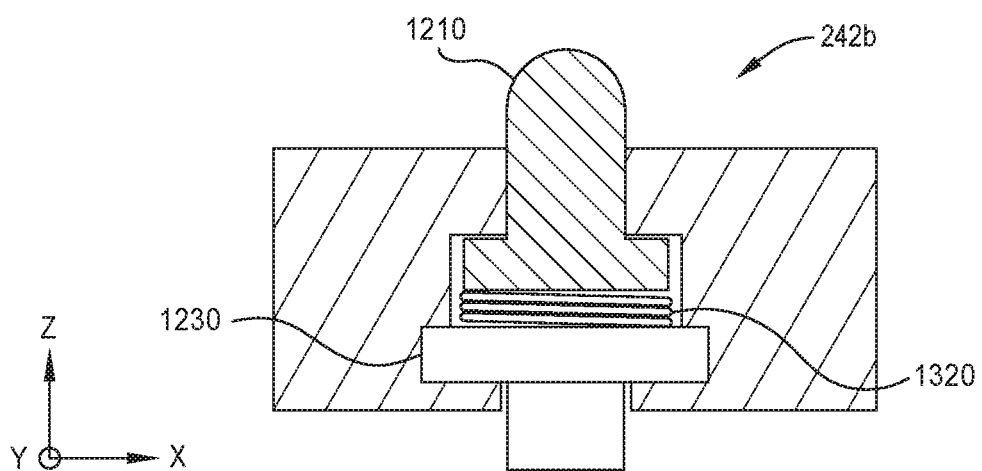
Figure 14:
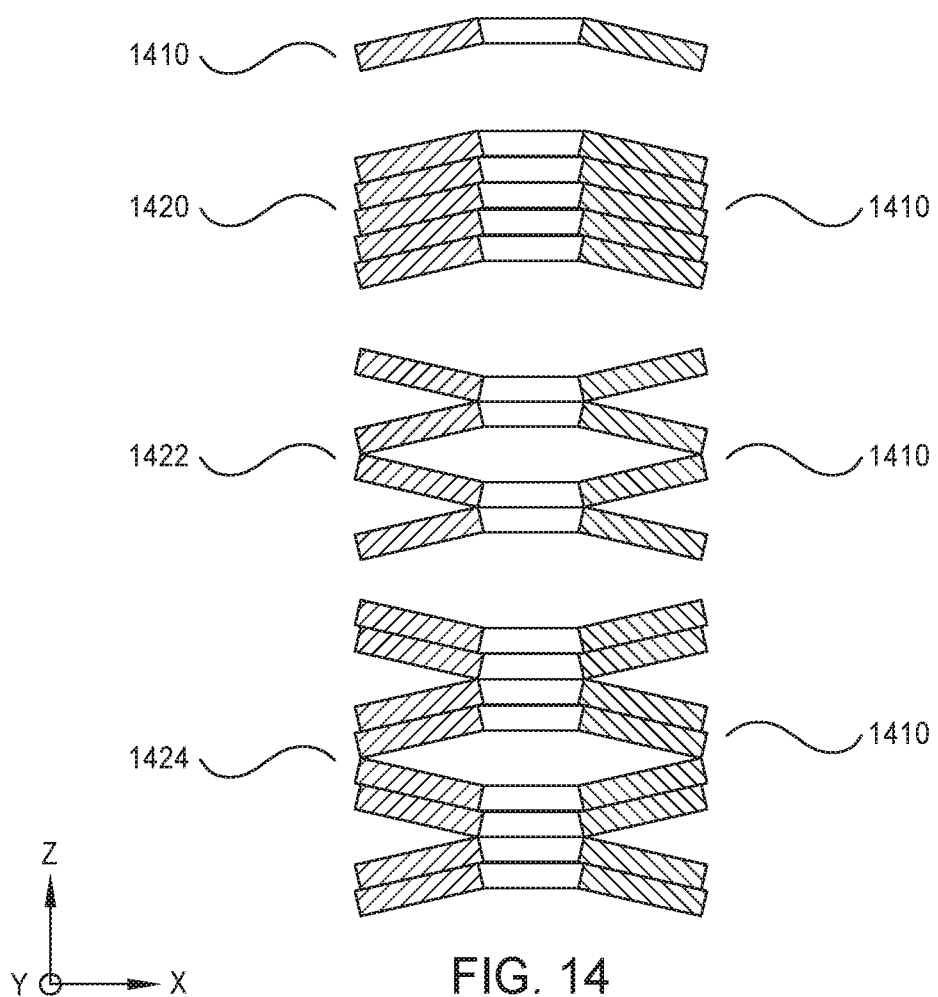
FIG. 14 illustrates various compliance elements, according to one or more embodiments.

In one embodiment, the compliance element 1220 is a spring. The compliance element 1220 may be a compression spring that compresses in response to an input force. As illustrated in FIG. 12, the compliance element 1220 may have an angled shape. Alternatively, as illustrated in FIG. 13, a compliance element 1320 includes one or more spring elements. The spring elements may be spring disks (e.g., the spring disks 1410 of FIG. 14). The compliance element 1320 may have a single spring disk 1410 or multiple spring disks 1410. Further, the spring disks 1410 may be disclosed in parallel with each other (e.g., compliance element 1420), in series with other (e.g., compliance element 1422), or a combination thereof (e.g., compliance element 1424). The number of the spring disks 1410 in a compliance member may be one or more. In one embodiment, the number of spring disks in a compliance member is four or more. In one or more embodiments, the compliance element 1220 is a device other than a spring and that is able to control the movement of the interface element 1210 in the Z direction.

The compliance element 1220 may have a spring constant of about 2 lb/mm to about 3 lb/mm. However, in other embodiments, spring constants of less than about 2 lb/mm or greater than about 3 lb/mm may be utilized. Further, the spring force may be about 3 lb/mm to about 4 lb/mm. The compression of the compliance element 1220 may be about 0.2 mm to about 0.7 mm. Alternatively, the compression of the compliance element 1220 may be less than about 0.2 mm or greater than about 0.7 mm. The compliance force for the pin 242a is about 1.3 lb/mm to about 1.6 lb/mm. However, in other embodiments, the compliance force for the pin 242a is less than about 1.3 lb/mm or greater than about 1.6 lb/mm. Further, the total spring force of the compliance element 1220 is about 2.5 lb/mm to about 3 lb/mm. Alternatively, the total spring force of the compliance element 1220 is less than 2.5 lb/mm or greater than about 3 lb/mm.

As stated above, the compliance element 1220 controls the amount that the interface element 1210 travels in the −Z direction when an external force is applied. Controlling the travel of the interface element 1210 ensures that sufficient contact is present between the pins 240 and 242 and the terminals 214 and 216 such that the AC and DC power signals are coupled from the pins 240 and 242 to the terminals 214 and 216. When no force (e.g., no load) is applied to the pins 240, the corresponding compliance element (e.g., the compliance element 1220) is not compressed and the compliance element places the interface element (e.g., the interface element 1210) of each pin 240 in the extended position. No force is applied to the pins 242 when an electrostatic chuck (e.g., the electrostatic chuck 287) and a substrate (e.g., the substrate 286) are not in contact with the substrate support 226. Further, in such an embodiment, the substrate support 226 is moved in the −Z direction away from the sealing assembly 235.

Figure 15:
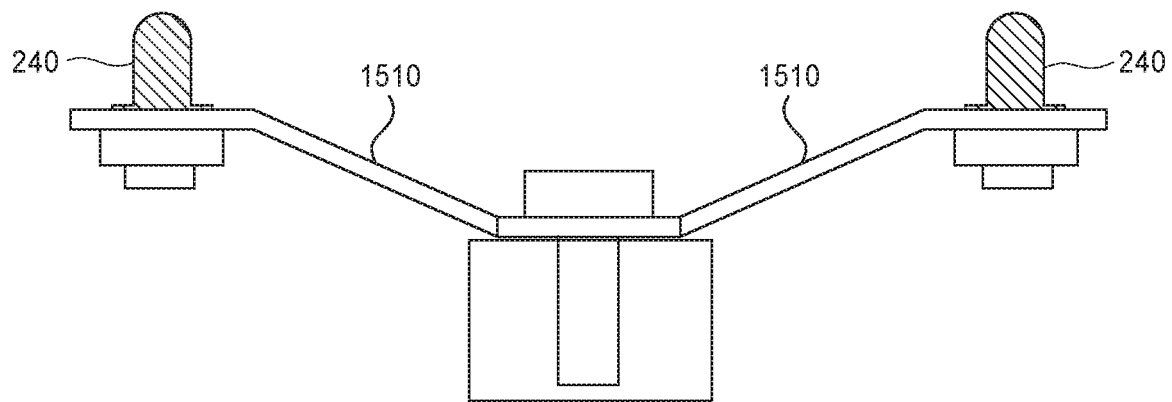
FIG. 15 illustrates pins of a substrate support, according to one or more embodiments.

FIG. 15 illustrates the pins 240 coupled to a compliance element 1510. The compliance element 1510 is coupled to each of the pins 240. The compliance element 1510 may be a flexure mechanism configured to control the movement of the pins 240 in the −Z direction in response to a force (e.g., force 1090) similar to that of the compliance element 1220.

Figure 16:
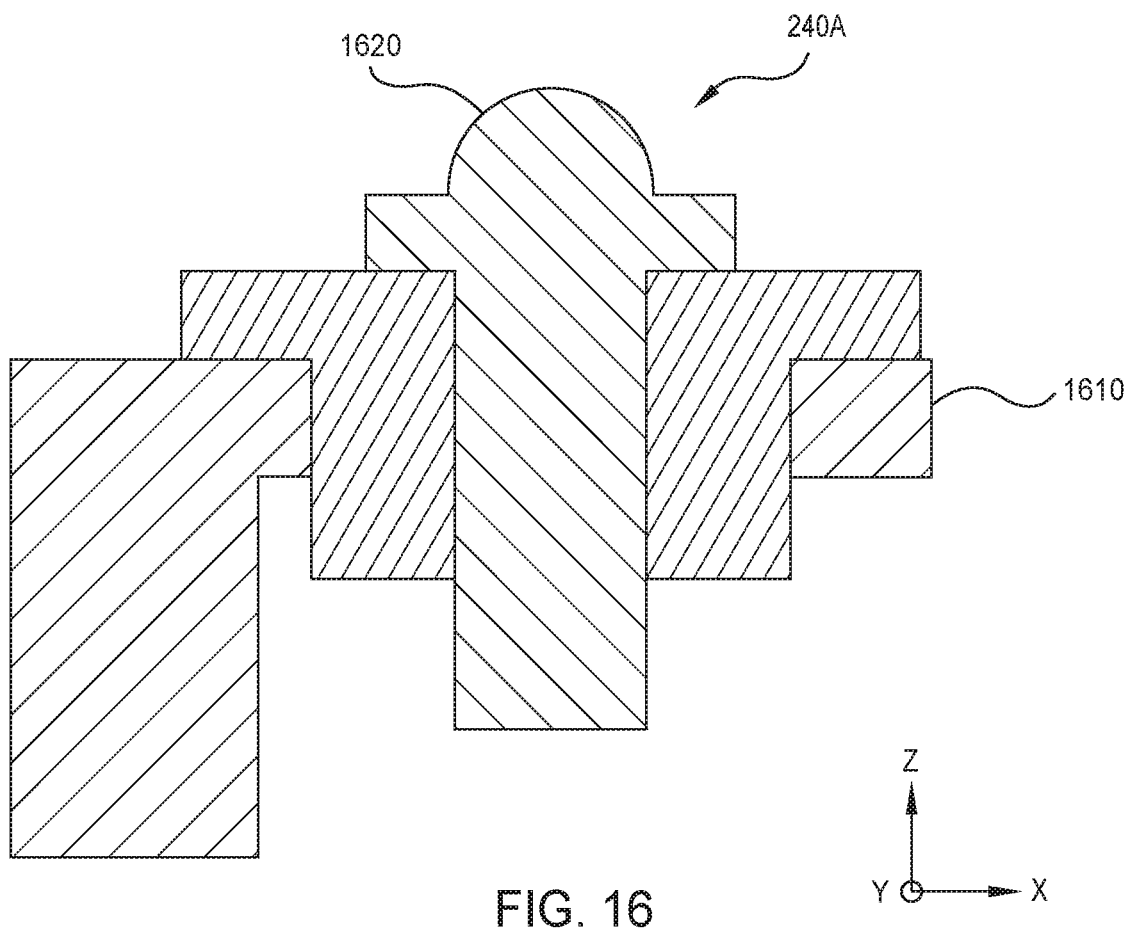
FIG. 16 illustrates pins of a substrate support, according to one or more embodiments.

The pins 240 are configured to aid in leveling the electrostatic chuck 287 and the substrate 286. As illustrated in FIG. 16, the pin 240A is configured to level the electrostatic chuck 287 and the substrate 286. For example, the pin 240a includes an interface element 1620 and a leveling element 1610. The interface element 1620 is configured to interface with one of the terminals 214. The leveling element 1610 flexes in the −Z direction in response to the weight of the electrostatic chuck 287 and the substrate 286. Each of the pins 240 is configured similar to that of the pin 240a. Accordingly, as each of the leveling elements 1610 flex (e.g., move) in the −Z direction, in response to the force 1090, the surface of the substrate 286 is leveled. The leveling elements 1610 provide about +/−2 mm of movement. Alternatively, the leveling elements 1610 provide less than about +/−2 mm or more than +/−2 mm of movement. Each of the leveling elements 1610 may provide a common amount movement or different amounts of movement according to the weight of the electrostatic chuck 287 and the substrate 286 to level the substrate 286.

Referring to FIGS. 2A and 2B, the electrostatic chuck 287 and the substrate 286 are loaded into the processing region 160 via a transfer arm 210 of the central transfer apparatus 145 and positioned over the pedestal assembly 224. The pedestal lift assembly 291 moves the substrate support 226 vertically toward the electrostatic chuck 287 such that the alignment elements 1060 interface with the centering elements 218, centering the electrostatic chuck 287 with the substrate support 226. The initial force applied by the electrostatic chuck 287 and the substrate 286 corresponds to the combined weight of the electrostatic chuck 287 and the substrate 286. For example, the initial force applied by the electrostatic chuck 287 and the substrate 286 is about 5 lb to about 10 lb. Further, the pins 240 and 242 do not contact the terminals 214 and 216. Alternatively, the pins 240 and 242 partially contact the terminals 214 and 216, however, the pins 240 and 242 do not support the weight of the electrostatic chuck 287 and the substrate 286.

The pedestal lift assembly 291 further moves the substrate support 226 about 8 mm to about 12 mm in the +Z direction such that the pins 242 contact the terminals 216. Alternatively, the pedestal lift assembly 291 moves the substrate support 226 less than about 8 mm or greater than about 12 mm, or another distance in the +Z direction such that the pins 242 contact the terminals 216. The pins 242 support about 5 percent to about 10 percent of the weight of the electrostatic chuck 287 and the substrate 286. The pins 242 include a compliance element (e.g., the compliance element 1220) that aids in establishing an electrical contact between the interface element (e.g., the interface element 1210) and a respective one of the terminals 216.

The pedestal lift assembly 291 moves the substrate support 226 about 0.5 mm to about 2.5 mm to establish an interface between the flexible element 280 and the electrostatic chuck 287. Alternatively, the pedestal lift assembly 291 moves the substrate support 226 greater than 0 mm but less 0.5 mm or greater than 2.5 mm, or another distance in the +Z direction such that flexible element 280 contacts the bottom of the electrostatic chuck 287.

The flexible element 280 supports about 20 percent to about 30 percent of the force 1090 (e.g., weight of the electrostatic chuck 287 and the substrate 286). Alternatively, the flexible element 280 supports less than about 20 percent or more than about 30 percent of the weight of the electrostatic chuck 287 and the substrate 286. In various embodiments, the amount of weight supported by the flexible element 280 (e.g., the amount of force in the −Z direction) generates a seal between the flexible element 280 and the bottom of the electrostatic chuck 287.

The pedestal lift assembly 291 moves the substrate support 226 about 1 mm to about 3 mm to establish an interface between the pins 240 and the terminals 214. Alternatively, the pedestal lift assembly 291 moves the substrate support 226 less than about 1 mm or greater than about 3 mm. The pedestal lift assembly 291 moves the substrate support 226 to generate a coupling between the pins 240 and the terminals 214. The amount of weight supported by each of the pins 240 is about 1.25 lb to about 1.75 lb. Alternatively, the amount of weight supported by each of the pins 240 is less than about 1.25 lb or greater than about 1.75 lb. The amount of weight supported by each pin 240 forms an electrical contact between the pin 240 and the terminal 214.

While the foregoing is directed to embodiments of the present disclosure, other and further embodiments of the disclosure may be devised without departing from the basic scope thereof, and the scope thereof is determined by the claims that follow.

What is claimed is:

1. A pedestal assembly for a processing region, the pedestal assembly comprising:
a substrate support;
first pins coupled to the substrate support, configured to mate with first terminals of an electrostatic chuck, and configured to be coupled to a first power source, each of the first pins comprises:
an interface element; and
a compliance element supporting the interface element;
second pins coupled to the substrate support, configured to mate with second terminals of the electrostatic chuck, and configured to be coupled to a second power source;
alignment elements coupled to the substrate support and configured to interface with centering elements of the electrostatic chuck; and
a flexible element coupled to the substrate support, configured to interface with a passageway of the electrostatic chuck, and configured to couple to a gas source.

2. The pedestal assembly of claim 1, wherein the first pins are configured to support a first portion of a weight of the electrostatic chuck.

3. The pedestal assembly of claim 2, wherein the compliance element of each of the first pins is configured to control movement of the interface element of a corresponding one of the first pins in response to the first portion of the weight of the electrostatic chuck.

4. The pedestal assembly of claim 3, wherein the compliance element of each of the first pins is a spring having a spring constant of about 2 lb/mm to about 3 lb/mm.

5. The pedestal assembly of claim 2, wherein the flexible element is configured to support a second portion of the weight of the electrostatic chuck, the first portion differs from the second portion.

6. The pedestal assembly of claim 1, wherein at least one pin selected from the group consisting of the first pins and the second pins has a flat surface, concave surface, convex surface, or a grooved surface.

7. The pedestal assembly of claim 6, wherein at least one pin selected from the group consisting of the first pins and the second pins has a surface roughness in a range of about 2 Ra to about 6 Ra.

8. The pedestal assembly of claim 1, wherein the first pins and the second pins are removably coupled to the substrate support.

9. The pedestal assembly of claim 1, wherein a pedestal lift assembly is configured to apply vertical motion to the substrate support.

10. A processing region comprising:
a sealing assembly; and
a pedestal assembly configured to move between a processing position and a transfer position, the pedestal assembly comprising:
a substrate support;
first pins coupled to the substrate support, configured to mate with first terminals of an electrostatic chuck, and configured to couple to a first power source, each of the first pins comprises:
an interface element; and
a compliance element supporting the interface element;
second pins coupled to the substrate support, configured to mate with second terminals of the electrostatic chuck, and configured to couple to a second power source;
alignment elements coupled to the substrate support and configured to interface with centering elements of the electrostatic chuck; and
a flexible element coupled to the substrate support, configured to interface with a passageway of the electrostatic chuck and configured to couple to a gas source, wherein when the pedestal assembly is the processing position, a portion of the electrostatic chuck is configured to mate with a portion of the sealing assembly to form a processing volume.

11. The processing region of claim 10, wherein the first pins are configured support a first portion of a weight of the electrostatic chuck.

12. The processing region of claim 11, wherein the compliance element of each of the first pins is configured to control movement of the interface element of a corresponding one of the first pins in response to the first portion of the weight of the electrostatic chuck.

13. The processing region of claim 12, wherein the compliance element of each of the first pins is a spring having a spring constant of about 2 lb/mm to about 3 lb/mm.

14. The processing region of claim 11, wherein the flexible element is configured to support a second portion of the weight of the electrostatic chuck, the first portion differs from the second portion.

15. The processing region of claim 10, wherein at least one pin selected from the group consisting of the first pins and the second pins has a flat surface, concave surface, convex surface, or a grooved surface.

16. The processing region of claim 10, wherein at least one pin selected from the group consisting of the first pins and the second pins has a surface roughness in a range of about 2 Ra to about 6 Ra.

17. A cluster tool assembly comprising:
a central transfer apparatus comprising a transfer arm, the transfer arm comprising first pins configured to mate with first terminals of an electrostatic chuck; and
a processing region comprising;
a pedestal assembly configured to move between a processing position and transfer position, the pedestal assembly comprising:
a substrate support;
second pins coupled to the substrate support, configured to mate with second terminals of the electrostatic chuck, and configured to couple to a first power source, each of the second pins comprises:
an interface element; and
a compliance element supporting the interface element;
third pins coupled to the substrate support, configured to mate with third terminals of the electrostatic chuck, and configured to couple to a second power source;
alignment elements coupled to the substrate support and configured to interface with centering elements of the electrostatic chuck; and
a flexible element coupled to the substrate support, configured to interface with a passageway of the electrostatic chuck and configured to couple to a gas source.

18. The cluster tool assembly of claim 17, wherein the second pins are configured support a first portion of a weight of the electrostatic chuck, and wherein the compliance element of each of the second pins is configured to control movement of the corresponding interface element of each of the second pins in response to the first portion of the weight of the electrostatic chuck.

19. The cluster tool assembly of claim 18, wherein the compliance element of each of the first pins is a spring.

20. The cluster tool assembly of claim 18, wherein the flexible element is configured to support a second portion of the weight of the electrostatic chuck, the first portion differs from the second portion.

* * * * *